US012298669B2

(12) United States Patent
Sun et al.

(10) Patent No.: US 12,298,669 B2
(45) Date of Patent: May 13, 2025

(54) COMPOSITION COMPRISING THREE ALKANOLAMINES AND A HYDROXYLAMINE FOR REMOVING ETCH RESIDUES

(71) Applicant: Versum Materials US, LLC, Tempe, AZ (US)

(72) Inventors: Laisheng Sun, Gilbert, AZ (US); Lili Wang, Chandler, AZ (US); Aiping Wu, Chandler, AZ (US); Yi-Chia Lee, Chupei (TW); Tianniu Chen, Westford, MA (US)

(73) Assignee: Versum Materials US, LLC, Tempe, AZ (US)

( * ) Notice: Subject to any disclaimer, the term of this patent is extended or adjusted under 35 U.S.C. 154(b) by 535 days.

(21) Appl. No.: 17/753,256

(22) PCT Filed: Sep. 24, 2020

(86) PCT No.: PCT/US2020/052406
§ 371 (c)(1),
(2) Date: Feb. 25, 2022

(87) PCT Pub. No.: WO2021/061922
PCT Pub. Date: Apr. 1, 2021

(65) Prior Publication Data
US 2022/0380705 A1 Dec. 1, 2022

Related U.S. Application Data

(60) Provisional application No. 62/906,810, filed on Sep. 27, 2019.

(51) Int. Cl.
| | | |
|---|---|---|
| *C11D 3/30* | (2006.01) | |
| *C11D 7/26* | (2006.01) | |
| *C11D 7/32* | (2006.01) | |
| *C11D 7/34* | (2006.01) | |
| *G03F 7/42* | (2006.01) | |

(52) U.S. Cl.
CPC ............. *G03F 7/425* (2013.01); *C11D 7/261* (2013.01); *C11D 7/265* (2013.01); *C11D 7/3218* (2013.01); *C11D 7/3227* (2013.01); *C11D 7/34* (2013.01); *G03F 7/426* (2013.01); *C11D 2111/22* (2024.01)

(58) Field of Classification Search
CPC ........... C11D 7/3218; C11D 3/43; C11D 3/30; C11D 7/50; C11D 7/5004; C11D 7/5013; C11D 2111/22
See application file for complete search history.

(56) References Cited

U.S. PATENT DOCUMENTS

| | | |
|---|---|---|
| 5,279,771 A | 1/1994 | Lee |
| 5,334,332 A | 8/1994 | Lee |
| 5,419,779 A | 5/1995 | Ward |
| 5,994,046 A * | 11/1999 | Kawai .................. G03C 7/3022 430/517 |
| 6,367,486 B1 | 4/2002 | Lee et al. |
| 2001/0004633 A1 | 6/2001 | Naghshineh et al. |
| 2001/0006936 A1* | 7/2001 | Lee ................... H01L 21/31133 257/E21.255 |
| 2002/0068684 A1 | 6/2002 | Peters et al. |
| 2003/0228990 A1 | 12/2003 | Lee |
| 2004/0142835 A1 | 7/2004 | Takashima |
| 2009/0203566 A1* | 8/2009 | Lee .......................... G03F 7/425 510/175 |
| 2011/0076852 A1* | 3/2011 | Takahashi .............. C11D 7/265 257/E21.224 |
| 2011/0118165 A1* | 5/2011 | Lee ................... H01L 21/02074 510/176 |
| 2013/0061882 A1* | 3/2013 | Wu ....................... C11D 3/0073 134/26 |
| 2013/0296215 A1 | 11/2013 | Rao et al. |
| 2014/0109931 A1* | 4/2014 | Lee ...................... C11D 7/3281 510/176 |
| 2016/0179011 A1 | 6/2016 | Agarwal |
| 2017/0335248 A1* | 11/2017 | Oie .......................... G03F 7/423 |
| 2018/0051237 A1* | 2/2018 | Seino ..................... C11D 7/261 |

FOREIGN PATENT DOCUMENTS

| | | |
|---|---|---|
| CN | 100341992 A | 1/2004 |
| CN | 102732393 A | 10/2012 |
| JP | 2007128038 A | 5/2007 |
| JP | 201180042 | 4/2011 |
| JP | 2016148834 A | 8/2016 |
| KR | 20010044011 A | 1/2001 |
| KR | 101459725 B1 | 11/2014 |
| TW | 200413522 A | 11/1992 |

(Continued)

OTHER PUBLICATIONS

Intellectual Property Office of Singapore; Search Report; Application No. 11202202275R; Mar. 8, 2024.
Search Report, ROC (Taiwan) Patent Application No. 109133041, Aug. 5, 2024.
International Search Report; PCT/US2020/052406; Jan. 7, 2021.
Search Report, ROC (Taiwan Patent Application No. 109133041), Feb. 2, 2024.

*Primary Examiner* — Charles I Boyer

(74) *Attorney, Agent, or Firm* — William T. Slaven, IV

(57) ABSTRACT

A method and cleaning composition for microelectronic devices or semiconductor substrates including at least one alkanolamine; at least one hydroxylamine or derivatives of hydroxylamine or mixtures thereof; at least one polyfunctional organic acid with at least two carboxylic acid groups and water. The cleaning compositions can further include at least one corrosion inhibitor.

11 Claims, 1 Drawing Sheet

(56) References Cited

FOREIGN PATENT DOCUMENTS

| | | |
|---|---|---|
| TW | I299885 B | 8/2008 |
| TW | 201113367 A | 4/2011 |
| TW | 201732028 A | 9/2017 |
| WO | 2009058275 A1 | 5/2009 |
| WO | 2017099211 A1 | 6/2017 |

\* cited by examiner

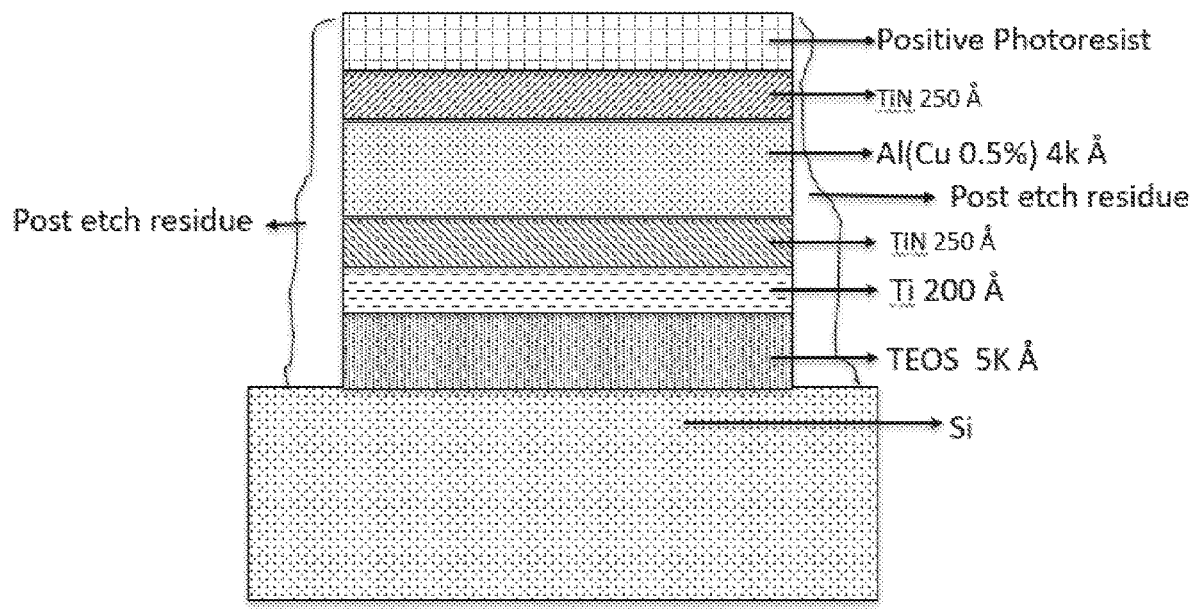

COMPOSITION COMPRISING THREE ALKANOLAMINES AND A HYDROXYLAMINE FOR REMOVING ETCH RESIDUES

This application is a national stage application, filed under 35 U.S.C. § 371, of International Patent Application No. PCT/US2020/052406 (filed on 24 Sep. 2020) which claims the benefit of U.S. Provisional Patent Application No. 62/906,810 (filed on 27 Sep. 2019) each of which applications is incorporated herein by reference in their entirety.

BACKGROUND

Field

The disclosed and claimed subject matter relates to a post etch residue cleaning composition and method for use in microelectronics manufacturing.

Related Art

Numerous steps are involved in the fabrication of microelectronic structures. Within the manufacturing scheme of fabricating integrated circuits, selective etching of different surfaces of the semiconductor is sometimes required. Historically, a number of different types of etching processes to selectively remove materials have been successfully utilized. Moreover, the selective etching of different layers, within the microelectronic structure, is considered an important step in the integrated circuit fabrication process.

In the manufacture of semiconductors and semiconductor microcircuits, it is frequently necessary to coat substrate materials with a polymeric organic substance. Examples of some substrate materials includes, aluminum, titanium, copper, silicon dioxide coated silicon wafer, optionally having metallic elements of aluminum, titanium, or copper, and the like. Typically, the polymeric organic substance is a photoresist material. This is a material which will form an etch mask upon development after exposure to light. In subsequent processing steps, at least a portion of the photoresist is removed from the surface of the substrate. One common method of removing photoresist from a substrate is by wet chemical means. The wet chemical compositions are formulated to remove the photoresist from the substrate with compatible to any metallic circuitry, the inorganic substrate and the substrate itself. Another method of removing photoresist is by a dry ash method where the photoresist is removed by plasma ashing. The residues remaining on the substrate after plasma ash may be the photoresist itself or a combination of the photoresist, underlying substrate and/or etch gases. These residues are often referred to as sidewall polymers, veils or fences.

Increasingly, reactive ion etching (RIE), is the process of choice for pattern transferring during via, metal line and trench formation. For instance, complex semiconductor devices require multiple layers of back end of line interconnect wiring, utilize RIE to produce vias, metal lines and trench structures. Vias are used, through the interlayer dielectric, to provide contact between one level of silicon, silicide or metal wiring and the next level of wiring. Metal lines are conductive structures used as device interconnects. Trench structures are used in the formation of metal line structures. Vias, metal lines and trench structures typically expose metals and alloys such as Al, Al and Cu alloys, Cu, Ti, TiN, Ta, TaN, W, TiW, silicon or a silicide such as a silicide of tungsten, titanium or cobalt. The RIE process typically leaves a residue or a complex mixture that may include re-sputtered oxide material, organic materials from photoresist, and/or antireflective coating materials used to lithographically define the vias, metal lines and or trench structures.

Removal of these plasma etching residues is accomplished by exposing the substrates to a formulated solution. Conventional cleaning formulations typically contain a hydroxylamine, an alkanolamine, water and a corrosion inhibitor. For example, one composition is disclosed in U.S. Pat. No. 5,279,771 where the plasma etching residues left by plasma etching was cleaned by a cleaning solution composed of water, alkanolamine, and hydroxylamine. Another example disclosed in U.S. Pat. No. 5,419,779 is a plasma etch residue cleaning solution that is composed of water, alkanolamine, hydroxylamine and catechol.

Although these formulated solutions can effectively clean plasma etching residues, the presence of hydroxylamine can attack the metallic layers such as aluminum and titanium layers. Corrosion inhibitors have been added to formulations to lower etch rates of metals, such as the etch rates of aluminum, copper and titanium. Catechol and gallic acid have been used as corrosion inhibitors for lowering metal etch rates; however, catechol and gallic acid and their derivatives in some cases do not effectively protect against metal corrosion, especially for AlCu alloys. Due to the difference in the standard reduction potentials between aluminum and copper in AlCu alloy metal lines, in addition to the corrosion of the individual metals (Al and Cu) in the solutions, galvanic corrosion issues such as pitting corrosion on AlCu metal lines occurs. In order to well prevent the various possible corrosion on AlCu metal lines, new formulations are needed to better protect the corrosion of AlCu metal lines.

Therefore, there remains a need for improved formulations that effectively remove plasma etch residues from substrates without harming the layers, including metal layers on the substrates.

SUMMARY

The disclosed and claimed subject matter directed to a cleaning composition that contains polyfunctional organic acid useful for removing plasma post etch residues from a microelectronic device or semiconductor substrate.

In one embodiment, the composition includes:
(i) at least one alkanolamine of the formula:

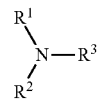

wherein $R^1$, $R^2$ and $R^3$ are each independently selected from:
  (a) hydrogen,
  (b1) a $C_1$-$C_{20}$ straight chain alkyl group,
  (b2) a $C_4$-$C_{20}$ branch chain alkyl group,
  (b3) a $C_3$-$C_{20}$ cyclic alkyl group;
  (c) an unsubstituted $C_2$-$C_{20}$ alkyl ether group;
  (d) a $C_1$-$C_{20}$ alkanol group, and
  (e) a $C_2$-$C_{20}$ alkyl ether group substituted with an —OH group, wherein at least one of $R^1$, $R^2$ and $R^3$ must be
    (d) or (e);
(ii) at least one hydroxylamine or derivatives of hydroxylamine or mixtures thereof;

(iii) at least one polyfunctional organic acid with at least two carboxylic acid groups; and (iv) water.

In a further aspect of this embodiment, the composition can include other optional components. In a further aspect of this embodiment, the at least one alkanolamine includes a mixture of two or more alkanolamines. In a further aspect of this embodiment, the at least one alkanolamine includes a mixture of three or more alkanolamines. In a further aspect of this embodiment, the at least one alkanolamine, the two or more alkanolamines or the three or more alkanolamines includes at least one ether containing alkanolamine. In a further aspect of this embodiment, the at least one alkanolamine consists of a mixture of two alkanolamines. In a further aspect of this embodiment, the at least one alkanolamine consists of a mixture of three alkanolamines.

In another embodiment, the composition further includes (v) at least one corrosion inhibitor. In a further aspect of this embodiment, the composition can include other optional components.

In a further embodiment, the composition consists essentially of (i) the at least one alkanolamine; (ii) the at least one hydroxylamine or its derivatives or mixtures thereof, (iii) water and (iv) the at least one polyfunctional organic acid in varying concentrations. In such an embodiment, the combined amounts of (i), (ii), (iii) and (iv) do not equal 100% by weight, and can include other ingredients (e.g., additional solvent(s), common additives and/or impurities) that do not materially change the effectiveness of the composition.

In a further embodiment, the composition consists essentially of (i) the at least one alkanolamine; (ii) the at least one hydroxylamine or its derivatives or mixtures thereof, (iii) water, (iv) the at least one polyfunctional organic acid and (v) the at least one corrosion inhibitor in varying concentrations. In such an embodiment, the combined amounts of (i), (ii), (iii), (iv) and (v) do not equal 100% by weight, and can include other ingredients (e.g., additional solvent(s), common additives and/or impurities) that do not materially change the effectiveness of the composition.

In a further embodiment, the composition consists of (i) the at least one alkanolamine; (ii) the at least one hydroxylamine or its derivatives or mixtures thereof, (iii) water and (iv) the at least one polyfunctional organic acid in varying concentrations. In such an embodiment, the combined amounts of (i), (ii), (iii) and (iv) equal approximately 100% by weight but may include other small and/or trace amounts of impurities that are present in such small quantities that they do not materially change the effectiveness of the composition. For example, in one such embodiment, the composition can contain 2% by weight or less of impurities. In another embodiment, the composition can contain 1% by weight or less than of impurities. In a further embodiment, the composition can contain 0.05% by weight or less than of impurities.

In a further embodiment, the composition consists of (i) the at least one alkanolamine; (ii) the at least one hydroxylamine or its derivatives or mixtures thereof, (iii) water, (iv) the at least one polyfunctional organic acid and (v) the at least one corrosion inhibitor in varying concentrations. In such an embodiment, the combined amounts of (i), (ii), (iii), (iv) and (v) equal approximately 100% by weight but may include other small and/or trace amounts of impurities that are present in such small quantities that they do not materially change the effectiveness of the composition. For example, in one such embodiment, the composition can contain 2% by weight or less of impurities. In another embodiment, the composition can contain 1% by weight or less than of impurities. In a further embodiment, the composition can contain 0.05% by weight or less than of impurities.

The disclosed and claimed subject further contemplates a method of removing residues from a microelectronic device or semiconductor substrate that includes the step of contacting the substrate containing residues with one or more of the cleaning compositions described herein.

BRIEF DESCRIPTION OF THE DRAWINGS

The accompanying drawings, which are included to provide a further understanding of the disclosed subject matter and are incorporated in and constitute a part of this specification, illustrate embodiments of the disclosed subject matter and together with the description serve to explain the principles of the disclosed subject matter. In the drawings:

FIG. 1 illustrates the patterned wafer structure used for cleaning tests.

DEFINITIONS

Unless otherwise stated, the following terms used in the specification and claims shall have the following meanings for this application.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the disclosed and claimed subject matter (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted, but also include the partially closed or closed terms of "consisting essentially of" and "consisting of" Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosed and claimed subject matter and does not pose a limitation on the scope of the disclosed and claimed subject matter unless otherwise claimed. No language in the specification should be construed as indicating any non-claimed element as essential to the practice of the disclosed and claimed subject matter. All percentages are weight percentages and all weight percentages are based on the total weight of the composition (prior to any optional concentration and/or dilution thereof). Any reference to "at least one" could be substituted with "one or more." "At least one" and/or "one or more" includes "at least two" or "two or more" and "at least three" and "three or more" and so on.

Preferred embodiments of the disclosed and claimed subject matter are described herein. Variations of those preferred embodiments may become apparent to those of ordinary skill in the art upon reading the foregoing description. The inventors expect skilled artisans to employ such variations as appropriate, and the inventors intend for the disclosed and claimed subject matter to be practiced otherwise than as specifically described herein. Accordingly, the disclosed and claimed subject matter includes all modifications and equivalents of the subject matter recited in the claims appended hereto as permitted by applicable law. Moreover, any combination of the above-described elements in all possible variations thereof is encompassed by the disclosed and claimed subject matter unless otherwise indicated herein or otherwise clearly contradicted by context.

For ease of reference, "microelectronic device" corresponds to semiconductor substrates, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly. The microelectronic device or semiconductor substrates may include low-k dielectric material, barrier materials, and metals, such as, AlCu alloys, W, Ti, TiN, as well as other materials thereon.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

The term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, and other refractory metals and their nitrides and silicides.

"Substantially free" is defined herein as less than 0.1 wt. %, or less than 0.01 wt. %, and most preferably less than 0.001 wt % or less than 0.0001 wt %, or less than 1 ppb. "Substantially free" also includes 0.0000 wt. % and 0 ppb. The term "free of" means 0.0000 wt. % or 0 ppb.

As used herein, the terms "about" and "approximately" are intended to correspond to ±5% of the stated value.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

The disclosed and claimed subject matter provides a composition and method including same for selectively removing residues such as, for example, ashed photoresist and/or processing residues from microelectronic devices. In a cleaning method involving articles such as substrates useful for microelectronic devices, typical contaminants to be removed may include, one or more of the following examples, organic compounds such as exposed and ashed photoresist material, ashed photoresist residue, UV- or X-ray-hardened photoresist, C—F-containing polymers, low and high molecular weight polymers, and other organic etch residues; inorganic compounds such as metal oxides, ceramic particles from chemical mechanical planarization (CMP) slurries and other inorganic etch residues; metal containing compounds such as organometallic residues and metal organic compounds; ionic and neutral, light and heavy inorganic (metal) species, moisture, and insoluble materials, including particles generated by processing such as planarization and etching processes. In one particular embodiment, residues removed are processing residues such as those created by reactive ion etching.

Moreover, the ashed photoresist and/or processing residues are typically present on a semiconductor substrate (microelectronic device), that also includes metal (such as copper, aluminum), silicon, silicate and/or interlevel dielectric material such as deposited silicon oxides and derivatized silicon oxides such as HSQ, MSQ, FOX, TEOS and Spin-On Glass, and/or high-k materials, such as hafnium silicate, hafnium oxide, barium strontium titanium (BST), $Ta_2O_5$, and $TiO_2$, wherein both the photoresist and/or residues and the metal, silicon, silicide, interlevel dielectric materials and/or high-k materials will come in contact with the cleaning composition. In addition, the composition disclosed herein may exhibit minimal etch rates of certain dielectric materials such as silicon oxide. The composition and method disclosed herein provides for selectively removing residues without significantly attacking one or more of the following: metal(s), silicon, silicon dioxide, interlevel dielectric materials, and/or high-k materials. In one embodiment, the composition disclosed herein may be suitable for structures containing sensitive low k-films. In certain embodiments, the substrate may contain one or more metals, such as, but not limited to, copper, copper alloy, aluminum, aluminum alloy, titanium, titanium nitride, tantalum, tantalum nitride, tungsten, and titanium/tungsten, one or more of which are not attacked by the cleaning composition.

DETAILED DESCRIPTION

It is to be understood that both the foregoing general description and the following detailed description are illustrative and explanatory, and are not restrictive of the subject matter, as claimed. The objects, features, advantages and ideas of the disclosed subject matter will be apparent to those skilled in the art from the description provided in the specification, and the disclosed subject matter will be readily practicable by those skilled in the art on the basis of the description appearing herein. The description of any "preferred embodiments" and/or the examples which show preferred modes for practicing the disclosed subject matter are included for the purpose of explanation and are not intended to limit the scope of the claims.

It will also be apparent to those skilled in the art that various modifications may be made in how the disclosed subject matter is practiced based on described aspects in the specification without departing from the spirit and scope of the disclosed subject matter disclosed herein.

I. Alkanolamines

The alkanolamines useful in the disclosed and claimed subject matter include one or more alkanol groups and one or more amine groups. The structure for the alkanolamines useful in the disclosed and claimed subject matter has Formula I:

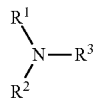

wherein $R^1$, $R^2$ and $R^3$ are each independently selected from:
(a) hydrogen,
(b1) a $C_1$-$C_{20}$ straight chain alkyl group,
(b2) a $C_4$-$C_{20}$ branch chain alkyl group,
(b3) a $C_3$-$C_{20}$ cyclic alkyl group;
(c) an unsubstituted $C_2$-$C_{20}$alkyl ether group;
(d) a $C_1$-$C_{20}$alkanol group
(e) a $C_2$-$C_{20}$alkyl ether group substituted with an —OH group; and
wherein at least one of $R^1$, $R^2$ and $R^3$ must be (d) or (e).

In a further aspect, the composition can include other optional components. In a further aspect of this embodiment, the at least one alkanolamine includes a mixture of two or more alkanolamines. In a further aspect of this embodiment, the at least one alkanolamine includes a mixture of three or more alkanolamines. In a further aspect of this embodiment, the at least one alkanolamine, the two or more alkanolamines or the three or more alkanolamines includes at least one ether containing alkanolamine. In a further aspect of this embodiment, the at least one alkanolamine consists of a mixture of two alkanolamines. In a further aspect of this embodiment, the at least one alkanolamine consists of a mixture of three alkanolamines In one embodiment, (b1) is a $C_1$-$C_{15}$ straight chain alkyl group. In another embodiment, (b1) is a $C_1$-$C_{10}$ straight chain alkyl group. In another embodiment, (b1) is a $C_1$-$C_7$ straight chain alkyl group. In another embodiment, (b1) is a $C_1$-$C_5$ straight chain alkyl group. In another embodiment, (b1) is a $C_1$-$C_4$ straight chain alkyl group. In another embodiment, (b1) is a $C_1$-$C_3$ straight chain alkyl group. In another embodiment, (b1) is a $C_1$-$C_2$ straight chain alkyl group. In another embodiment, (b1) is a $C_5$ straight chain alkyl group. In another embodiment, (b1) is a $C_4$ straight chain alkyl group. In another embodiment, (b1) is a $C_3$ straight chain alkyl group. In another embodiment, (b1) is a $C_2$ straight chain alkyl group. In another embodiment, (b1) is a $C_1$ straight chain alkyl group.

In one embodiment, (b2) is a $C_4$-$C_{15}$ branch chain alkyl group. In another embodiment, (b2) is a $C_4$-$C_{10}$ branch chain alkyl group. In another embodiment, (b2) is a $C_4$-$C_7$ branch chain alkyl group. In another embodiment, (b2) is a $C_4$-$C_5$ branch chain alkyl group. In another embodiment, (b2) is a $C_5$ branch chain alkyl group. In another embodiment, (b2) is a $C_7$ straight chain alkyl group. In another embodiment, (b2) is a $C_6$ straight chain alkyl group. In another embodiment, (b2) is a $C_5$ straight chain alkyl group. In another embodiment, (b2) is a $C_4$ branch chain alkyl group.

In one embodiment, (b3) is a $C_3$-$C_{15}$ cyclic alkyl group. In another embodiment, (b3) is a $C_3$-$C_{10}$ cyclic alkyl group. In another embodiment, (b3) is a $C3_1$-$C_7$ cyclic alkyl group. In another embodiment, (b3) is a $C_3$-$C_5$ cyclic alkyl group. In another embodiment, (b3) is a $C_3$-$C_4$ cyclic alkyl group. In another embodiment, (b3) is a $C_6$ cyclic alkyl group. In another embodiment, (b3) is a $C_5$ cyclic alkyl group. In another embodiment, (b3) is a $C_4$ cyclic alkyl group. In another embodiment, (b3) is a $C_3$ cyclic alkyl group.

Alkyl ether group (c) includes (i) a $C_2$-$C_{20}$ straight chain alkyl group, (ii) a $C_4$-$C_{20}$ branch chain alkyl group and (iii) a $C_3$-$C_{20}$ cyclic alkyl group where (i), (ii) and (iii) have an oxygen atom (attached between carbons) within the respective alkyl groups. In (i), (ii) and (iii) the total number of carbons is from 2 to 20, or 2 to 15, or 2 to 10, or 2 to 7, or 2 to 5, or 2 to 4, or 2 to 3 carbons.

Alkanol group (d) includes (i) a $C_1$-$C_{20}$ straight chain alkyl group, (ii) a $C_4$-$C_{20}$ branch chain alkyl group and (iii) a $C_3$-$C_{20}$ cyclic alkyl group. In (i), (ii) and (iii) the total number of carbons is, as structurally appropriate, from 1 to 20, or 2 to 15, or 2 to 10, or 2 to 7, or 2 to 5, or 2 to 4, or 2 to 3 carbons, and further having at least one —(R)(R)—OH linked to a carbon in the alkyl group, where each R is independently H or an alkyl group (as just defined with fewer carbons than the $R^1$, $R^2$ or $R^3$ group it is a part of).

Alkyl ether group substituted with an —OH group (e) includes (i) a $C_2$-$C_{20}$ straight chain alkyl group, (ii) a $C_4$-$C_{20}$ branch chain alkyl group and (iii) a $C_3$-$C_{20}$cyclic alkyl group where (i), (ii) and (iii) have an oxygen atom (attached between carbons) within the alkyl group. In (i), (ii) and (iii) the total number of carbons is from 2 to 20, or 2 to 15, or 2 to 10, or 2 to 7, or 2 to 5, or 2 to 4, or 2 to 3 carbons, and further having at least one —(R)(R)—OH linked to a carbon in the alkyl group, where each R is independently H or an alkyl group (as just defined with fewer carbons than the $R^1$, $R^2$ or $R^3$ group it is a part of).

Alkanolamines containing either (c) or (e) will be referred to as "ether containing alkanolamines." Preferred ether containing alkanolamines have (e) an alkyl ether group further having an —OH group. For both (d) and (e), the —(R)(R)—OH linked to a carbon is preferably a terminable group, that is, both R groups are H.

In one embodiment, the composition includes alkanolamines of Formula I where $R^1$ and $R^2$ are hydrogen and $R^3$ is selected from (d) and (e). In a further aspect of this embodiment, the alkanolamine consists essentially of alkanolamines of Formula I where $R^1$ and $R^2$ are hydrogen and $R^3$ is selected from (d) and (e). In a further aspect of this embodiment, the alkanolamine consists of alkanolamines of Formula I where $R^1$ and $R^2$ are hydrogen and $R^3$ is selected from (d) and (e).

In another embodiment, the composition includes alkanolamines of Formula I where $R^1$ is (a), $R^2$ is (b1), (b2) or (b3) and $R^3$ is selected from (d) and (e). In a further aspect of this embodiment, the alkanolamine consists essentially of alkanolamines of Formula I where $R^1$ is (a), $R^2$ is (b1), (b2) or (b3) and $R^3$ is selected from (d) and (e). In a further aspect of this embodiment, the alkanolamine consists of alkanolamines of Formula I where $R^1$ is (a), $R^2$ is (b1), (b2) or (b3) and $R^3$ is selected from (d) and (e).

In another embodiment, the composition includes alkanolamines of Formula I where $R^1$ and $R^2$ are the same or different (b1), (b2) or (b3) and $R^3$ is selected from (d) and (e). In a further aspect of this embodiment, the alkanolamine consists essentially of alkanolamines of Formula I where $R^1$ and $R^2$ are the same or different (b1), (b2) or (b3) and $R^3$ is selected from (d) and (e). In a further aspect of this embodiment, the alkanolamine consists of alkanolamines of Formula I where $R^1$ and $R^2$ are the same or different (b1), (b2) or (b3) and $R^3$ is selected from (d) and (e).

In another embodiment, the composition includes alkanolamines of Formula I where $R^1$, $R^2$ and $R^3$ are all the same or different (d). In a further aspect of this embodiment, the alkanolamine consists essentially of alkanolamines of Formula I where $R^1$, $R^2$ and $R^3$ are all the same or different (d) In a further aspect of this embodiment, the alkanolamine consists of alkanolamines of Formula I where $R^1$, $R^2$ and $R^3$ are all the same or different (d).

In another embodiment, the composition includes alkanolamines of Formula I where $R^1$ is selected from (a), (b1), (b2) or (b3) and $R^2$ and $R^3$ are the same or different (d). In a further aspect of this embodiment, the alkanolamine consists essentially of alkanolamines of Formula I where $R^1$ is selected from (a), (b1), (b2) or (b3) and $R^2$ and $R^3$ are the same or different (d). In a further aspect of this embodiment, the alkanolamine consists of alkanolamines of Formula I where $R^1$ is selected from (a), (b1), (b2) or (b3) and $R^2$ and $R^3$ are the same or different (d).

In another embodiment, the composition includes alkanolamines of Formula I where $R^1$ is selected from (a), (b1), (b2) or (b3) and $R^2$ and $R^3$ are the same or different (e). In a further aspect of this embodiment, the alkanolamine consists essentially of alkanolamines of Formula I where $R^1$ is selected from (a), (b1), (b2) or (b3) and $R^2$ and $R^3$ are the same or different (e). In a further aspect of this embodiment, the alkanolamine consists of alkanolamines of Formula I where $R^1$ is selected from (a), (b1), (b2) or (b3) and $R^2$ and $R^3$ are the same or different (e).

As shown by the structures above, in some embodiments the alkanolamines useful in the compositions of the disclosed and claimed subject matter include two or more of the same or different (preferably the same) alkanol groups. In some embodiments, the alkanolamines include three or more of the same or different (preferably the same) alkanol groups.

Examples of alkanolamines useful in the disclosed and claimed subject matter are preferably miscible in water and include, but are not limited to, monoethanolamine (MEA), aminoethoxyethanol, methanolamine, N-methyl ethanolamine, N-ethyl ethanolamine, N, N-dimethylethanolamine, N, N-diethylethanolamine, N-methyl diethanolamine, N-ethyl diethanolamine, diethanolamine, triethanol amine (TEA), tertiarybutyldiethanol amine, isopropanolamine, 2-amino-1-propanol, 3-amino-1-propanol, 2-amino-1-butanol, isobutanolamine, 2-amino-2-ethoxypropanol, 2-amino-2-ethoxyethanol, and mixtures thereof.

Monoethanolamine (MEA), methanolamine, 2-amino-1-propanol, 3-amino-1-propanol, 2-amino-1-butanol, isobutanolamine and isopropanolamine are where $R^1$ and $R^2$ are hydrogen and $R^3$ is (d). N-methyl ethanolamine, N-ethyl ethanolamine, N, N-dimethylethanolamine, N, N-diethylethanolamine are where $R^1$ and $R^2$ are either H or b1 or b2, $R^3$ is d. Aminoethoxyethanol, 2-amino-2-ethoxypropanol and 2-amino-2-ethoxyethanol are examples of alkanolamines where $R^1$ and $R^2$ are hydrogen and $R^3$ is (e). N-methyl diethanolamine, N-ethyl diethanolamine, diethanolamine, triethanolamine (TEA), tertiarybutyldiethanol amine are those alkanolamines that include two or more of the same or different (preferably the same) alkanol groups (d) as $R^1$, $R^2$ and/or $R^3$. When $R^1$ and $R^2$ are the same alkanol groups $R^3$ is often selected from hydrogen or a straight chained, branched or cyclic alkyl group.

In some embodiments, mixtures of two or more alkanolamines are used. Thus, in a further aspect of this embodiment, the at least one alkanolamine includes a mixture of two or more alkanolamines. In a further aspect of this embodiment, the at least one alkanolamine consists of a mixture of two alkanolamines.

In some embodiments, mixtures of three or more alkanolamines are used. Thus, in a further aspect of this embodiment, the at least one alkanolamine includes a mixture of three or more alkanolamines. In a further aspect of this embodiment, the at least one alkanolamine consists of a mixture of three alkanolamines.

In a further aspect of this embodiment, (i) the at least one alkanolamine, (ii) the two or more alkanolamines or (iii) the three or more alkanolamines includes at least one ether containing alkanolamine.

In one embodiment, (i) the at least one alkanolamines, (ii) the at least two alkanolamines and (iii) the at least three alkanolamines are selected from aminoethoxyethanol, 2-amino-2-ethoxypropanol, 2-amino-2-ethoxyethanol, and mixtures thereof.

In another embodiment, (i) the at least one alkanolamines, (ii) the at least two alkanolamines and (iii) the at least three alkanolamines include monoethanolamine, isopropanolamine and 2-(2-aminoethoxy)ethanol. In a further aspect of this embodiment, the at least three alkanolamines consist essentially of monoethanolamine, the at least three alkanolamines consist of monoethanolamine, isopropanolamine and 2-(2-aminoethoxy)ethanol.

In some embodiments, the mixtures of two or more alkanolamines or three or more alkanolamines include at least one ether containing alkanolamine and at least one or two alkanolamines wherein $R^1$ and $R^2$ are hydrogen and $R^3$ is (d).

In some embodiments, the total amount of alkanolamines includes an amount in a range having start and end points selected from the following list of weight percentages, in any combination: 5, 10, 20, 22, 25, 28, 30, 32, 35, 38, 40, 43, 45, 48, 50, 52, 55, 57, 59, 60, 62, 64, 66, 68, 70, 72, 74, 76, 78, 80, 85 and 88. For example, the compositions may include from about 10% to about 85%, or from about 20% to about 80%, or from about 30% to about 70%, or from about 22% to about 66%, or from about 25% to about 59%, or from about 30% to about 62% by weight of the composition.

In some embodiments, one or more ether containing alkanolamines and one or more other alkanolamines may be present in the composition, such that the ratio of the one or more ether containing alkanolamines to the total weight of the alkanolamines is from 1:5 to 1:25, or from 1:10 to 1:20, or from 1:12 to 1:18, or from 1:13 to 1:17, or from 1:14 to 1:16.

II. Polyfunctional Organic Acid

As used herein, the term "polyfunctional organic acid" refers to an acid or a multi-acid that has more than one carboxylate group, including but not limited to, (i) dicarboxylate acids (such as oxalic acid, malonic acid, malic acid, tartaric acid, succinic acid et al.); dicarboxylic acids with aromatic moieties (such as phthalic acid et al.), methyliminodiacetic acid, nitrolotriacetic acid (NTA) and combinations thereof; (ii) tricarboxylic acids (e.g., citric acid, 2-methylpropane-1,2,3-triscarboxylic, benzene-1,2,3-tricarboxylic [hemimellitic], propane-1,2,3-tricarboxylic [tricarballylic], 1,cis-2,3-propenetricarboxylic acid [aconitic], and the like), (hydroxyethyl)ethylenediaminetriacetic acid (HEDTA), tricarboxylic acids with aromatic moieties (such as trimellitic acid, et al.), and combinations thereof; and (iii) tetracarboxylic acid such as, for example, ethylenediaminetetraacetic acid (EDTA), butylenediaminetetraacetic acid, (1,2-cyclohexylenedinitrilo-)tetraacetic acid (CyDTA), ethylenediaminetetrapropionic acid, N, N,N', N'-ethylenediaminetetra(methylenephosphonic) acid (EDTMP), 1,3-diamino-2-hydroxypropane-N,N,N',N'-tetraacetic acid (DHPTA), propylenediaminetetraacetic acid, and combinations thereof (iv) and others including diethylenetriaminepentaacetic acid (DETPA) and triethylenetetraminehexaacetic acid (TTHA) and combinations thereof. Alternative corrosion inhibitors that may be used in the composition of this disclosed and claimed subject matter include at least one polyfunctional organic acid that are not α-hydroxy acids, alone or in combination with one or more other corrosion inhibitors.

The preferred polyfunctional organic acids include citric acid, EDTA, CyDTA, HEDTA.

Citric acid, as well as other polyfunctional organic acids suitable for use in the compositions disclosed herein, functions as a corrosion inhibitor for aluminum, copper and the AlCu alloys and are useful to decrease or prevent the metal pitting caused by other corrosion inhibitors. Note, even though the polyfunctional acids are acting as corrosion inhibitors in the composition of the disclosed and claimed subject matter, the polyfunctional acids will not be referred to as corrosion inhibitors. The term corrosion inhibitor will be used to refer to different components below.

The amount of polyfunctional organic acid (neat) in the compositions of the disclosed and claimed subject matter includes an amount in a range having start and end points selected from the following list of weight percentages, in any combination: 0.05, 0.07, 0.1, 0.13, 0.15, 0.17, 0.2, 0.23, 0.25, 0.27, 0.3, 0.33, 0.35, 0.37, 0.4, 0.43, 0.45, 0.47, 0.5, 0.53, 0.55, 0.57, 0.6, 0.63, 0.65, 0.67, 0.7, 0.73, 0.75, 0.77, 0.8, 0.83, 0.85, 0.87, 0.9, 0.95, 1.0, 1.5, 2, 2.5, 3, 3.5, 4, 4.5, 5, 5.5, 6, 6.5, 7, 7.5, 8, 8.5, 9, 9.5, 10, 11, 12, 13, 14, 15 and 20. For examples, the one or more polyfunctional organic acids may be present in the composition from about 0.1 wt % to about 10 wt %, or from 0.050 wt % to 7.5 wt %, or from 0.15 wt % to 5.0 wt % or from about 0.2 to about 4 wt % based on the total weight of the composition of the disclosed and claimed subject matter.

III. Hydroxylamine

The cleaning compositions of the disclosed and claimed subject matter include hydroxylamine and/or one or more derivatives of hydroxylamine. Derivatives of hydroxylamine include substituted hydroxylamines and/or salts of hydroxylamine or salts of substituted hydroxylamines. Hydroxylamine is $H_2NOH$.

Substituted hydroxylamines are represented by the following formula:

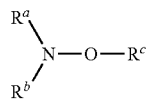

where $R^a$, $R^b$, and R are independently hydrogen; a substituted or unsubstituted $C_1$-$C_6$ straight alkyl, $C_4$-$C_6$ branched alkyl or $C_1$-$C_6$ cyclic alkyl, $C_1$-$C_6$ alkenyl group, or $C_1$-$C_6$ alkynyl group; a substituted or unsubstituted acyl group, amidyl group, alkylamino group, alkylsulfonyl group, or sulfonic acid group. Examples of useful compounds include when one or both of $R^a$ and $R^b$ are independently alkyl groups or H and $R^c$ is H, such as n-isopropylhydroxylamine, n-methylhydroxylamine, dimethylhydroxylamine, n-ethylhydroxylamine, diethylhydroxylamine, n-propylhydroxylamine, dipropylhydroxylamine, and n-tert-butyl-hydroxylamine. Examples of hydroxylamine derivatives where $R^a$ and $R^c$ are alkyl groups and $R^b$ is H are N,O-dimethylhydroxylamine. Examples of hydroxylamine derivatives for which $R^a$ and $R^b$ are H and $R^c$ is an alkyl group are O-methylhydroxylamine, O-ethylhydroxylamine and O-propylhydroxylamine.

Further, salts of hydroxylamine or salts of substituted hydroxylamine may be used in the compositions of the disclosed and claimed subject matter. Useful salts of hydroxylamine or salts of substituted hydroxylamine include hydroxylamine sulfate, hydroxylamine nitrate, hydroxylamine hydrochloride, N-tert-butylhydroxylamine hydrochloride, hydroxylamine phosphate, hydroxylamine acetate, N-(tert-butyl)hydroxylamine acetate, hydroxylamine citrate, hydroxylamine, perchlorate, N-methylhydroxylamine hydrochloride.

The preferred hydroxylamine and/or its derivative and/or salts thereof or mixtures thereof present in the compositions of the disclosed and claimed subject matter are hydroxylamine, and salts of hydroxylamine, such as hydroxylamine sulfate, hydroxylamine nitrate, hydroxylamine phosphate and hydroxylamine acetate.

The hydroxylamines, the derivatives of hydroxylamine or the salts of hydroxylamine or the salts of derivatives of hydroxylamines or mixtures thereof will be present in the composition in a total amount within a range having start and end points selected from the following list of weight percentages, in any combination: 5, 7, 10, 12, 20, 22, 25, 28, 30, 32, 35, 38, 40, 43, 45, 48, and 50. For examples, the composition may include from about 10% to about 45%, or from about 12% to about 40%, or from about 7% to about 35%, or from about 5% to about 30%, or from about 20% to about 40% by weight of the composition.

IV. Water

The cleaning compositions of the disclosed and claimed subject matter include water. In the disclosed and claimed subject matter, water functions in various ways such as, for example, to dissolve one or more solid components of the residue, as a carrier of the components, as an aid in the removal of metallic residue, as a viscosity modifier of the composition, and as a diluent. Preferably, the water employed in the cleaning composition is de-ionized (DI) water.

Water is included in an amount in a range having start and end points selected from the following list of weight percentages, in any combination: 5, 10, 13, 15, 17, 18, 20, 22, 25, 27, 30, 33, 35, 38, 40, 42, 45 and 50, for examples, from about 5% to about 50% by wt., or from about 10% to about 40% by wt., or about 10% to about 30% by wt., or from about 5% to about 35% by wt., or from about 5% to about 45% by wt., or from about 10% to about 33% by wt. of water. Still other preferred embodiments of the disclosed and claimed subject matter include water in an amount to achieve the desired weight percent of the other ingredients.

V. Corrosion Inhibitors

The compositions of the disclosed and claimed subject matter optionally include one or more than one corrosion inhibitors. The corrosion inhibitors useful in the disclosed and claimed subject matter may be phenol and derivatives of phenol. Examples of phenolic derivatives as corrosion inhibitors useful in the disclosed and claimed subject matter include catechol, t-butyl catechol, resorcinol, pyrogallol, p-benzenediol, m-benzenediol, o-benzenediol, 1,2,3-benzenetriol, 1,2,4-benzenetriol, and 1,3,5-benzenetriol, gallic acid, and derivatives of gallic acid, cresol, xylenol, salicyl alcohol, p-hydroxybenzyl alcohol, o-hydroxybenzyl alcohol, p-hydroxyphenethyl alcohol, p-aminophenol, m-aminophenol, diaminophenol, p-hydroxybenzoic acid, o-hydroxybenzoic acid, 2,4-dihydroxybenzoic acid, 2-5-dihydroxybenzoic acid, 3,4 dihydroxybenzoic acid and 3,5-dihydroxybenzoic acid. The phenolic derivative corrosion inhibitors useful in the disclosed and claimed subject matter may have at least two hydroxyl groups. The derivatives of gallic acid include methyl gallate, phenyl gallate, propyl gallate, 3,4,5 triacetoxygallic acid, trimethyl gallic acid methyl ester, ethyl gallate, and gallic acid anhydride.

The corrosion-inhibitors may be triazole compounds, alone or in combination with other corrosion inhibitors including the phenol and derivatives of phenol corrosion inhibitors. Exemplary triazole compounds include benzotriazole, o-tolyltriazole, m-tolyltriazole, p-tolyltriazole, carboxybenzotriazole, 1-hydroxybenzotriazole, nitrobenzotriazole and dihydroxypropylbenzotriazole. In some other embodiments, the corrosion inhibitor is a triazole and is at least one of benzotriazole, o-tolyltriazole, m-tolyltriazole, and p-tolyltriazole.

More than one corrosion inhibitors may also be used in the compositions of the disclosed and claimed subject matter. One mixture of corrosion inhibitors that may be used includes mixtures of phenol derivative type corrosion inhibitors, such as, a mixture of gallic acid and catechol.

The total amount of the one or more corrosion inhibitors in the cleaning composition of the disclosed and claimed subject matter may be in a range having start and end points selected from the following list of weight percentages, in any combination: 0, 0.1, 0.2, 0.5, 1, 1.5, 2, 2.5, 3, 3.5, 4, 4.5, 5, 5.5, 6, 6.5, 7, 7.5, 8, 8.5, 10, 12, 15, 20, for examples, from about 0.1% to about 15%, or from about 0.1% to about 10%, or from about 1% to about 8%, or from about 1.5% to about 5%, or from about 0.5% to about 10%, or from about 1% to about 12%, or from about 1% to about 10%, or from about 1% to about 9% by weight of the composition.

In some embodiments the compositions of the disclosed and claimed subject matter will be free of or substantially free of any or all of the above-listed additional corrosion inhibitors added to the composition including any or all of the triazole compounds or any of the individual triazole compounds listed above in any combination, and any of the individual phenol and derivatives of phenol compounds listed above in any combination.

Optional Ingredients

In other embodiments, the compositions may include or be substantially free of or free of any or all of hydroxylamine, oxidizer, surfactants, chemical modifiers, dyes, biocides, chelating agents, added acids, and/or added bases.

A. Water-Miscible Solvent

The etching compositions of the disclosed and claimed subject matter include a water-miscible solvent. Examples of water-miscible organic solvents that can be employed are N-methylpyrrolidone (NMP), 1-methoxy-2-propyl acetate (PGMEA), ethylene glycol, propylene glycol, butyl diglycol, 1,4-butanediol, tripropylene glycol methyl ether, propylene glycol propyl ether, diethylene gycol n-butyl ether (e.g., commercially available under the trade designation Dowanol DB), hexyloxypropylamine, poly(oxyethylene)diamine, dimethylsulfoxide, tetrahydrofurfuryl alcohol, glycerol, alcohols, sulfoxides, or mixtures thereof. Preferred solvents are alcohols, diols, or mixtures thereof.

In some embodiments of the disclosed and claimed subject matter, the water-miscible organic solvent may include a glycol ether. Examples of glycol ethers include ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl either, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol ethylene glycol monomethyl ether acetate, ethylene glycol monethyl ether acetate, propylene glycol methyl ether acetate, propylene glycol monomethyl ether, propylene glycol dimethyl ether, propylene glycol monobutyl ether, propylene glycol, monopropyl ether, dipropylene glycol monomethyl ether, dipropylene glycol monopropyl ether, dipropylene glycol monoisopropyl ether, dipropylene monobutyl ether, diproplylene glycol diisopropyl ether, tripropylene glycol monomethyl ether, 1-methoxy-2-butanol, 2-methoxy-1-butanol, 2-methoxy-2-methylbutanol, 1,1-dimethoxyethane and 2-(2-butoxyethoxy) ethanol.

For most applications, the amount of water-miscible organic solvent in the composition may be in a range having start and end points selected from the following list of weight percentages, in any combination: 0, 0.1, 0.5, 1, 5, 7, 12, 15, 20, 25, 30, 50, 60, and 70. Examples of such ranges of solvent include from about 0.5% to about 80% by weight; or from about 0.5% to about 65% by weight; or from about 1% to about 50% by weight; or from about 0.1% to about 30% by weight 0.5% to about 25% by weight; or from about 0.5% to about 15% by weight; or from about 1% to about 7% by weight; or from about 0.1% to about 12% by weight of the composition.

In some embodiments the compositions of the disclosed and claimed subject matter will be free of, or substantially free of, any or all of the above-listed water-miscible organic solvents in any combination, or all water-miscible organic solvents added to the composition.

B. Metal Chelating Agent

Another optional ingredient that can be used in the cleaning composition is a metal chelating agent which typically functions to increase the capacity of the composition to retain metals in solution and to enhance the dissolution of metallic residues. Some examples of chelating agents useful for this purpose are the following organic acids and their isomers and salts: N,N', N'-ethylenediaminetetra (methylenephosphonic) acid (EDTMP), salicylic acid, 8-hydroxyquinoline, and cysteine.

It is believed that, for most applications, if present, the chelating agent will be present in the composition in an amount of from about 0.01 to about 10% by weight, or from about 0.1 wt. % to about 10 wt. %, or from about 0.1 to about 5% by weight, or from about 0.5 wt. % to about 5 wt. % of the composition.

In some embodiments the compositions of the disclosed and claimed subject matter will be free of or substantially free of any or all of the above-listed metal chelating agents (in any combination).

C. Additional Optionally Included or Excluded Ingredients

In some embodiments, the compositions of the disclosed and claimed subject matter may be free of or substantially free of at least one, or more than one in any combination, or all of the following, or free of any additional of the following if already present in the composition: sulfur-containing compounds, bromine-containing compounds, chlorine-containing compounds, iodine-containing compounds, fluorine-containing compounds, halogen-containing compounds, phosphorus-containing compounds, metal-containing compounds, sodium-containing compounds, calcium-containing compounds, alkyl thiols, organic silanes, lithium-containing compound, silicon-containing compounds, oxidizing agents, peroxides, buffer species, polymers, inorganic acids, amides, metal hydroxides, abrasives, and surfactants.

Composition pH

The compositions of the disclosed and claimed subject matter may have a pH of about 9 or greater, such as, 9-14, 9-10, 9-11, or 10-12 or any pH in a range having the beginning and end-points of 9, 9.5, 10, 10.5, 11, 11.5, 12, 12.5, 13, 13.5 or 14. Additional basic components may optionally be added to adjust the pH, if needed. Examples of components that may be added to adjust the pH include amines, such as primary, secondary, tertiary or quaternary amines, or primary, secondary, tertiary or quaternary ammonium compounds. Alternatively, or additionally, ammonium salts may be included in the compositions too.

Examples of bases that may be added include quaternary ammonium hydroxides in which all of the alkyl groups are the same, such as, tetramethylammonium hydroxide, tetraethylammonium hydroxide, and/or tetrabutylammonium hydroxide and so on.

It is believed that if a base is added, it is added in an amount to provide the desired pH. The amount added may be in a weight percent range having start and end points selected from the following group of numbers: 0, 0.01, 0.05, 0.1, 0.2, 0.3, 0.5, 0.8, 1, 2, 3, 4, 5, 6, 7, 8, 9 and 10. Examples of ranges of base, if added to the composition of the disclosed and claimed subject matter, may be from about 0.1% to about 10% weight percent and, or from about 0.05 to about 8%, or from about from 0.01 to about 5%, or from about 0.01 to about 2%, or from about 0.05 to about 5% by weight of the composition.

In alternative embodiments the compositions may be free or substantially free of any added primary, secondary, tertiary or quaternary amines, and/or primary, secondary, tertiary or quaternary ammonium hydroxides and/or any added ammonium salts in any combination.

Methods of Use

The method described herein may be conducted by exposing or otherwise contacting (e.g., dipping or spraying one at a time or with a plurality of substrates into a bath that is sized to receive the plurality of substrates) a substrate having an organic or metal-organic polymer, inorganic salt, oxide, hydroxide, or complex or combination thereof present as a film or residue with the described composition. The actual conditions, e.g., temperature, time, etc. depend on the nature and the thickness of the material to be removed.

In general, the substrate is contacted or dipped into a vessel containing the cleaning composition of this disclosed and claimed subject matter at a temperature ranging from about 20° C. to about 90° C., or from about 20° C. to about 80° C., or from about 40° C. to about 80° C. Typical time periods for exposure of the substrate to the composition may range from, for example, 0.1 to 90 minutes, or 1 to 60 minutes, or 1 to 30 minutes. After contact with the composition, the substrate may be rinsed and then dried. Drying is typically carried out under an inert atmosphere and may include spinning. In certain embodiments, a deionized water rinse or rinse containing deionized water with other additives may be employed before, during, and/or after contacting the substrate with the composition described herein. In certain embodiments, organic solvents such as N-methyl-2-pyrrolidone (NMP) and isopropyl alcohol (IPA) may be employed before, during, and/or after contacting the substrate with the composition described herein.

Materials removed with the compositions described herein include ashed photoresists and processing residues known in the art by such names as sidewall polymers, veils, fences etch residue, ash residue and the like. In certain preferred embodiments, the photoresist is exposed, developed, etched and ashed prior to contact with the composition described herein. The compositions disclosed herein typically are compatible with low-k films such as HSQ (FOx), MSQ, SiLK, etc. The formulations may be effective in stripping ashed photoresists including positive and negative photoresists and plasma etch residues such as organic residues, organometallic residues, inorganic residues, metallic oxides, or photoresist complexes at low temperatures with very low corrosion of tungsten, aluminum, copper, titanium containing substrates. Moreover, the compositions are also compatible with a variety of high dielectric constant materials.

EXAMPLES

Reference will now be made to more specific embodiments of the present disclosure and experimental results that provide support for such embodiments. The examples are given below to more fully illustrate the disclosed subject matter and should not be construed as limiting the disclosed subject matter in any way.

It will be apparent to those skilled in the art that various modifications and variations can be made in the disclosed subject matter and specific examples provided herein without departing from the spirit or scope of the disclosed subject matter. Thus, it is intended that the disclosed subject matter, including the descriptions provided by the following examples, covers the modifications and variations of the disclosed subject matter that come within the scope of any claims and their equivalents.

In all tables, all amounts are given in weight percent and add up to 100 weight percent. The compositions disclosed herein were prepared by mixing the components together in a vessel at room temperature until all solids have dissolved.

Materials and Methods

The materials used in the various formulations described include ingredients that are commercially available and were used without further purifying unless otherwise noted.

In all of the following etch rates ("ER"), measurements were conducted at 20 minutes of exposure at 70° C. In determining the aluminum (contains 2% Cu) and titanium etch rates, the wafers had a blanket layer of a known thickness deposited upon it. The initial thickness of the wafer was determined using the CDE ResMap 273 Four Point Probe. After determining the initial thickness, test wafers were immersed in the exemplary compositions. After 20 minutes, the test wafers were removed from the test solution, rinsed with N-Methyl-2-pyrrolidone solvent first and then rinsed for three minutes with deionized water and completely dried under nitrogen. The thickness of each wafer was measured, and if necessary, the procedure was repeated on the test wafer. The etch rates were then obtained from the thickness change divided by the processing time.

The cleaning tests were carried out on patterned wafers with AlCu metal lines for evaluating cleaning performance of different solutions. The patterned wafer stack info is listed in FIG. 1. The substrates were immersed into the solutions with stirring of 400 rpm at different processing time and temperatures for all substrates. After exposure to the exemplary composition, the wafer(s) were rinsed with organic solvent intermediate rinse, here NMP is used and then deionized water and dried with nitrogen gas. The wafers were cleaved to provide an edge then examined using a Hitachi SU-8010 scanning electron microscopy (SEM) on a variety of pre-determined locations on the wafer and the results were visually interpreted.

Table 1 below shows the AlCu and W etch rates at 70° C. with formulations containing polycarboxylic acid as corrosion inhibitor. Without any polycarboxylic acid, the AlCu etch rate was high when alkanolamine and hydroxylamine were present in the solution. With a concentration increase of polycarboxylic acid, the AlCu etch rates decreased. W etch rates were also slightly decreased with an increase in polycarboxylic acid.

TABLE 1

AlCu and W Etch Rate Effect of Citric Acid Concentration (at 70° C.)

| Ingredients | Ex. 1 | Ex. 2 | Ex. 3 | Ex. 4 |
|---|---|---|---|---|
| Monoethanolamine | 25 | 25 | 25 | 25 |
| Isopropanolamine | 21 | 21 | 21 | 21 |
| 2-(2-Aminoethoxy)Ethanol | 15 | 14 | 13 | 11 |
| Hydroxylamine | 13 | 13 | 13 | 13 |
| Citric Acid | 0 | 1 | 2 | 4 |
| Water | 26 | 26 | 26 | 26 |
| pH at 5% | 10.6 | 10.6 | 10.6 | 10.6 |
| AlCu Etch Rate Å/min | 21.4 | 2.5 | 0.3 | 0.1 |
| W Etch Rate Å/min | 3.6 | 3 | 2.5 | 2.2 |

Table 2 below shows that when a hydroxylamine derivative (e.g., a hydroxylamine salt) was used the polycarboxylic acid could significantly decrease AlCu etch rates while only a slight increase in W etch rates.

TABLE 2

AlCu and W Etch Rate Effect of Citric Acid Concentration (at 70° C.)

| Ingredients | Ex. 5 | Ex. 6 | Ex. 7 |
|---|---|---|---|
| Monoethanolamine | 23 | 23 | 23 |
| Isopropanolamine | 19 | 18 | 17 |
| 2-(2-Aminoethoxy)Ethanol | 6 | 6 | 6 |
| Hydroxylamine Sulfate | 28 | 28 | 28 |
| Citric Acid | 0 | 1 | 2 |
| Water | 24 | 24 | 24 |
| 5% pH | 9.6 | 9.6 | 9.6 |
| AlCu Etch Rate Å/min | 6.0 | 0.1 | 0.1 |
| W Etch Rate Å/min | 1.0 | 2.5 | 2.0 |

Table 3 below shows that using a different polycarboxylic acid, EDTA, reduces AlCu etch rates.

TABLE 3

AlCu and W Etch Rate Effect of EDTA Concentration (at 70° C.)

| Ingredients | Ex. 8 | Ex. 9 | Ex. 10 |
|---|---|---|---|
| Monoethanolamine | 39 | 39 | 39 |
| Isopropanolamine | 7 | 6 | 5 |
| 2-(2-Aminoethoxy)Ethanol | 14 | 14 | 14 |
| Hydroxylamine Sulfate | 20 | 20 | 20 |
| EDTA | 0 | 1 | 2 |
| Water | 20 | 20 | 20 |
| AlCu Etch Rate Å/min | 2.0 | 1.4 | 0.9 |
| W Etch Rate Å/min | 0.9 | 1.1 | 1 |

Tables 4 and 5 below demonstrate that when a polycarboxylic acid (2 citric acid) was present in the formulation, AlCu etch rates remained low even with higher hydroxylamine and water concentrations. Table 5 shows the effect of polycarboxylic acid and hydroxylamine concentrations on AlCu etch rates. In particular, it is demonstrated that AlCu etch rates could be low when polycarboxylic acid concentration was 0.5 up to 2.5% by weight.

TABLE 4

Etch Rate Effect of Hydroxylamine and Water Concentration (at 70° C.)

| Ingredients | Ex. 11 | Ex. 12 | Ex. 13 | Ex. 14 |
|---|---|---|---|---|
| Monoethanolamine | 23 | 23 | 23 | 23 |
| Isopropanolamine | 19 | 19 | 19 | 16 |
| 2-(2-Aminoethoxy)Ethanol | 13 | 3 | 3 | 2 |
| Hydroxylamine Sulfate | 20 | 30 | 27 | 27 |
| Citric Acid | 2 | 2 | 2 | 2 |
| Water | 23 | 23 | 26 | 30 |
| 5% pH | 10.05 | 9.55 | 9.7 | 9.57 |
| AlCu Etch Rate Å/min | 0 | 0 | 0.4 | 0.1 |
| W Etch Rate Å/min | 1.6 | 2.8 | 3 | 2.7 |

TABLE 5

| Ingredients | Ex. 15 | Ex. 16 | Ex. 17 | Ex. 18 |
|---|---|---|---|---|
| Monoethanolamine | 31.4 | 21.4 | 21.4 | 21.4 |
| Isopropanolamine | 17.7 | 17.7 | 17.7 | 17.7 |
| 2-(2-Aminoethoxy)Ethanol | 10.4 | 3.4 | 18.4 | 5.4 |
| Hydroxylamine Sulfate | 15.0 | 30.0 | 15.0 | 30.0 |
| Citric Acid | 0.5 | 2.5 | 2.5 | 0.5 |
| Water | 25.0 | 25.0 | 25.0 | 25.0 |
| 5% pH | 10.22 | 9.49 | 10.12 | 9.65 |
| AlCu Etch Rate Å/min | 9.9 | 0.6 | 0.3 | 2.3 |
| W Etch Rate Å/min | 1.8 | 2.8 | 1.2 | 3 |

Tables 6 and 7 below show that the addition of citric acid still decreased AlCu etch rates even when catechol and gallic acid were included as corrosion inhibitor in the formulations. Increasing the water concentration above 3000 seemed to increase AlCu etch rates for these formulations.

TABLE 6

| Ingredients | Ex. 19 | Ex. 20 | Ex. 21 | Ex. 22 |
|---|---|---|---|---|
| Monoethanolamine | 25.3 | 25.3 | 25.3 | 25.3 |
| Isopropanolamine | 17.25 | 17 | 22.25 | 22 |
| 2-(2-Aminoethoxy)Ethanol | 6.7 | 6.7 | 6.7 | 6.7 |
| Hydroxylamine Sulfate | 20 | 20 | 15 | 15 |
| Catechol | 3.5 | 3.5 | 3.5 | 3.5 |
| Gallic Acid | 1 | 1 | 1 | 1 |
| Citric Acid | 0.25 | 0.5 | 0.25 | 0.5 |
| Water | 26 | 26 | 26 | 26 |
| 5% pH | 9.97 | 9.97 | 10.2 | 10.2 |
| AlCu Etch Rate Å/min | 6.4 | 1.6 | 2.6 | 2.1 |
| W Etch Rate Å/min | 2.0 | 1.75 | 1.5 | 1.5 |

TABLE 7

| Ingredients | Ex. 22 | Ex. 23 | Ex. 24 | Ex. 25 |
|---|---|---|---|---|
| Monoethanolamine | 25.3 | 25.3 | 25.3 | 25.3 |
| Isopropanolamine | 15.25 | 13.75 | 6.25 | 4.75 |
| 2-(2-Aminoethoxy)Ethanol | 6.7 | 6.7 | 6.7 | 6.7 |
| Hydroxylamine Sulfate | 24 | 24 | 24 | 24 |
| Catechol | 1.75 | 1.75 | 1.75 | 1.75 |
| Citric Acid | 1 | 2.5 | 1 | 2.5 |
| Water | 26 | 26 | 35 | 35 |
| 5% pH | 9.9 | 9.85 | 9.7 | 9.65 |
| AlCu Etch Rate Å/min | 5.8 | 1 | 3.7 | 3.5 |
| W Etch Rate Å/min | 2.1 | 2.3 | 2.9 | 2.2 |

Table 8 below lists the formulations used to do the cleaning tests on pattern wafers. The patterned wafer structure was shown in FIG. 1. Before cleaning, the photoresist layer and the post etch residue were clearly observed on the surface of metal lines.

TABLE 8

Formulations Used for Cleaning Tests

| Ingredients | Ex. 26 | Ex. 27 | Ex. 28 |
|---|---|---|---|
| Monoethanolamine | 25.3 | 25.3 | 25.3 |
| Isopropanolamine | 19.25 | 13.25 | 13 |
| 2-(2-Aminoethoxy)Ethanol | 6.7 | 6.7 | 6.7 |
| Hydroxylamine Sulfate | 20 | 24 | 24 |
| Catechol | 1.75 | 3.5 | 4.5 |
| Gallic Acid | 0.5 | 1 | 0 |
| Citric Acid | 0.5 | 0.25 | 0.5 |
| Water | 26 | 26 | 26 |
| 5% pH | 10.1 | 9.87 | 9.93 |
| AlCu Etch Rate Å/min | 2.7 | 3.2 | 0.9 |
| W Etch Rate Å/min | 1.9 | 1.8 | 1.4 |
| Ti etch rate Å/min | 0.2 | 0.03 | 0.1 |
| TiN etch rate Å/min | 0 | 0 | 0 |

Table 9 below shows that after cleaning at 70° C. for 30 minutes, all photoresist layers and post etch residues were completely cleaned for all three formulations. Among the three formulations, Ex. 28 showed the best cleaning performance at 70° C. for 10 minutes. In particular, Ex. 28 Formulation completely removed the photoresist layer and the post etch residues after 10 minutes at 70° C., while Ex. 27 could only clean the post etch residues but not the entire photoresist layers after 10 minutes at 70° C.

TABLE 9

| Example | Temp/ °C. | Time/ min | Intermediate Rinse | PR Clean | Residue Clean | AlCu Metal Line |
|---|---|---|---|---|---|---|
| Ex. 26 | 70 | 10 | NMP | No | Yes | No etch |
| Ex. 26 | 70 | 30 | NMP | Yes | Yes | No etch |
| Ex. 27 | 70 | 10 | NMP | No | Yes | No etch |
| Ex. 27 | 70 | 30 | NMP | Yes | Yes | No etch |
| Ex. 28 | 70 | 10 | NMP | Yes | Yes | No etch |
| Ex. 28 | 70 | 30 | NMP | Yes | Yes | No etch |

As shown in Table 10 below, Ex. 28 had lower than expected solution weight loss during bath life tests compared to known commercially available hydroxylamine-containing solutions. For this test, 100 g of the Ex. 28 solution was heated at 70° C. and 400 rpm in an open beaker and the weight loss was recorded over time. Ex. 28 lost the weight shown in Table 10, which was about half the evaporation rate expected as compared to results for known hydroxylamine-containing solutions.

TABLE 10

| Composition Time (hours) | Ex. 28 Weight loss (g) |
|---|---|
| 12 | 4 |
| 24 | 9 |
| 26 | 11 |
| 48 | 39.5 |

Table 11 below reports the cleaning performance of bath life tests. During a 4-hour bath life test, the evaporated solution was either replenished with water or fresh Ex. 28 solution. The cleaning performance was then evaluated on the patterned wafers after contacting the solution at 70° C. for 30 minutes. As Table 11 shows, the cleaning performance and the AlCu metal lines were unaffected by either the water or the solution replenishment for Ex. 28.

TABLE 11

Bath life and Replenishment Tests (at 70° C. for 30 minutes)

| Example | Replenishment | PR Removal | Residue Clean | AlCu Metal Line |
|---|---|---|---|---|
| Ex. 28 | Ex.28 | Yes | Yes | No etch |
| Ex. 28 | water | Yes | Yes | No etch |

Table 12 below reports the results of diluting Ex. 28 with 20% by weight added water and evaluating the cleaning performance on the patterned wafers after contacting the wafers (i.e., submerging the wafer pieces in a beaker of Ex. 28) to the solution at 70° C. for 30 minutes. These tests show that Ex. 28 can maintain its cleaning performance and low AlCu etch rates even when diluted with water.

TABLE 12

Effect of Water Addition on Cleaning Performance (at 70° C. for 30 minutes)

| Example | Water Added | PR Removal | Residue Clean | AlCu Metal Line |
|---|---|---|---|---|
| Ex. 28 | 0% | Yes | Yes | No etch |
| Ex. 28 | 20% | Yes | Yes | No etch |

Results

The compositions and methods of the disclosed and claimed subject matter mostly, or preferably, completely cleaned the photoresist and residues off the semiconductor substrates and provided an AlCu etch rate of 10 Å/min or less, or 8 Å/min or less, or 6 Å/min or less, or 2 Å/min or less, or 1.5 Å/min or less at 70° C. Further, the composition and methods of the disclosed and claimed subject matter additionally provided W, Ti, and TiN etch rates of 10 Å/min or less, or 8 Å/min or less, or 6 Å/min or less, or 2 Å/min or less, or 1.5 Å/min or less at 70° C.

Although the disclosed and claimed subject matter has been described and illustrated with a certain degree of particularity, it is understood that the disclosure has been made only by way of example, and that numerous changes in the conditions and order of steps can be resorted to by those skilled in the art without departing from the spirit and scope of the disclosed and claimed subject matter.

What is claimed is:

1. A composition for cleaning microelectronic devices or semiconductor substrates consisting of:
  (i) at least three alkanolamines;
  (ii) at least one of hydroxylamine or hydroxylamine sulfate;
  (iii) citric acid;
  (iv) water; and
  (v) optionally one or more corrosion inhibitor selected from the group consisting of catechol and gallic acid.

2. The composition of claim 1, wherein the 1) at least three alkanolamines are selected from the group consisting of monoethanolamine (MEA), aminoethoxyethanol, methanolamine, N-methyl ethanolamine, N-ethyl ethanolamine, N, N-dimethylethanolamine, N, N-diethylethanolamine, N-methyl diethanolamine, N-ethyl diethanolamine, diethanolamine, triethanol amine (TEA), tertiarybutyldiethanol amine, isopropanolamine, 2-amino-1-propanol, 3-amino-1-propanol, 2-amino-1-butanol, isobutanolamine, 2-amino-2-ethoxypropanol, 2-amino-2-ethoxyethanol and mixtures thereof.

3. The composition of claim 1, wherein the at least three alkanolamines include aminoethoxyethanol, 2-amino-2-ethoxypropanol, 2-amino-2-ethoxyethanol.

4. The composition of claim 1, wherein the at least three alkanolamines include monoethanolamine, isopropanolamine; and 2-(2-aminoethoxy) ethanol.

5. The composition of claim 1, wherein the composition comprises hydroxylamine sulfate.

6. The composition of claim 1, wherein the composition comprises hydroxylamine.

7. The composition of claim 1, comprising (v) the one or more corrosion inhibitor selected from the group consisting of catechol and gallic acid.

8. The composition of claim 7, wherein the (v) one or more corrosion inhibitor comprises catechol.

9. The composition of claim 7, wherein the (v) one or more corrosion inhibitor comprises gallic acid.

10. The composition of claim 7, wherein the at least three alkanolamines include monoethanolamine, isopropanolamine; and 2-(2-aminoethoxy) ethanol.

11. The composition of claim 10, wherein the composition has a pH of between approximately 9.5 and approximately 10.6.

\* \* \* \* \*